US010121953B2

(12) United States Patent
Tamaki et al.

(10) Patent No.: US 10,121,953 B2
(45) Date of Patent: *Nov. 6, 2018

(54) THERMOELECTRIC CONVERSION MATERIAL (71) Applicant: Panasonic Intellectual Property Management Co., Ltd., Osaka (JP)

(72) Inventors: Hiromasa Tamaki, Osaka (JP); Tsutomu Kanno, Kyoto (JP); Hiroki Sato, Nara (JP); Akihiro Sakai, Nara (JP); Kohei Takahashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 251 days.

This patent is subject to a terminal disclaimer.

(21) Appl. No.: 15/243,832

(22) Filed: Aug. 22, 2016

(65) Prior Publication Data
US 2017/0117453 A1 Apr. 27, 2017

Related U.S. Application Data (63) Continuation of application No. PCT/JP2016/000811, filed on Feb. 17, 2016.

(30) Foreign Application Priority Data

Oct. 27, 2015 (JP) .................................. 2015-210901

(51) Int. Cl.
*H01L 35/16* (2006.01)
*H02N 3/00* (2006.01)
(Continued)

(52) U.S. Cl.
CPC ............ *H01L 35/16* (2013.01); *C04B 35/547* (2013.01); *C22C 1/0408* (2013.01); *C22C 23/00* (2013.01)

(58) Field of Classification Search
CPC ............................ H01L 35/16; C04B 35/547
See application file for complete search history.

(56) References Cited

U.S. PATENT DOCUMENTS 6,444,894 B1    9/2002  Sterzel

FOREIGN PATENT DOCUMENTS

EP        2270890 A2      1/2011
WO    WO 2017/143213   *  8/2017

OTHER PUBLICATIONS

The Extended European Search Report dated Feb. 2, 2017 for the related European Patent Application No. 16747429.5.
(Continued)

*Primary Examiner* — C Melissa Koslow
(74) *Attorney, Agent, or Firm* — McDermott Will & Emery LLP (57) ABSTRACT The present invention provides a thermoelectric conversion material represented by the following chemical formula $Mg_{3+m}A_aB_bD_{2-e}E_e$. The element A represents at least one selected from the group consisting of Ca, Sr, Ba and Yb. The element B represents at least one selected from the group consisting of Mn and Zn. The value of m is not less than −0.39 and not more than 0.42. The value of a is not less than 0 and not more than 0.12. The value of b is not less than 0 and not more than 0.48. The element D represents at least one selected from the group consisting of Sb and Bi. The element E represents at least one selected from the group consisting of Se and Te. The value of e is not less than 0.001 and not more than 0.06. The thermoelectric conversion material has a $La_2O_3$ crystalline structure. The thermoelectric conversion material is of n-type. The present invention provides a novel thermoelectric conversion material.

5 Claims, 7 Drawing Sheets

C1: Mg, Ca, Sr, Ba, Yb, Mn, or Zn
C2: Sb, Bi, Se or Te

(51) Int. Cl.
    *C22C 12/00*     (2006.01)
    *C22C 30/00*     (2006.01)
    *C22C 30/06*     (2006.01)
    *C04B 35/547*     (2006.01)
    *C22C 1/04*     (2006.01)
    *C22C 23/00*     (2006.01)

(56) References Cited

OTHER PUBLICATIONS

Condron C L et al: "Thermoelectric properties and microstructure of Mg3Sb2", Journal of Solid State Chemistry, Orlando, FL, US, vol. 179, No. 8, Aug. 1, 2006 (Aug. 1, 2006), pp. 2252-2257, XP024951971.
Communication pursuant to Article 94(3) EPC dated Jan. 16, 2018 for the related European Patent Application No. 16747429.5.
Kajikawa T et al: "Thermoelectric properties of intermetallic compounds: Mg3Bi2 and Mg3Sb2 for medium temperature range thermoelectric elements", Thermoelectrics, 2003 Twenty-Second International Conference on—ICT La Grande Motte, France Aug. 17-21, 2003, Piscataway, NJ, USA, IEEE, Aug. 17, 2003 (Aug. 17, 2003), pp. 305-308, XP010697245.
International Search Report of PCT application No. PCT/JP2016/000811 dated Apr. 26, 2016.
V. Ponnambalam et al., "On the Thermoelectric Properties of Zintl Compounds Mg3Bi2-xPnx(Pn=P and Sb)", Journal of Electronic Materials, vol. 42, No. 7, 2013, pp. 1307-1312.
A. Bhardwaj et al., "Mg3Sb2-based Zintl compound: a non-toxic, inexpensive and abundant thermoelectric material for power generation", RSC Advances, 2013, vol. 3, pp. 8504-8516.
Soohyun Kim et al., "Thermoelectric properties of Mn-doped Mg-Sb single crystals", Journal of Materials Chemistry A, 2014, vol. 2, pp. 12311-12316.

* cited by examiner

THERMOELECTRIC CONVERSION MATERIAL

BACKGROUND

1. Technical Field

The present invention relates to a thermoelectric conversion material.

2. Description of the Related Art

V. Ponnambalam et. al., "On the Thermoelectric Properties of Zintl Compounds $Mg_3Bi_{2-x}Pn_x$ (Pn=P and Sb)", Journal of Electronic Materials, Vol. 42, No. 7, 2013, pp. 1307-1312 discloses a thermoelectric conversion material represented by the chemical formula $Mg_3Bi_{2-x}Pn_x$ (Pn=P and Sb).

A. Bhardwaj et. al., "$Mg_3Sb_2$-based Zintl compound: a non-toxic, inexpensive and abundant thermoelectric material for power generation", RSC Advances, 2013, Vol. 3, pp. 8504-8516 discloses a thermoelectric conversion material represented by the chemical formula $Mg_3Sb_{2-x}Bi_x$ ($0 \leq x \leq 0.4$).

Soohyun Kim et. al., "Thermoelectric properties of Mn-doped Mg—Sb single crystals", Journal of Materials Chemistry, 2014, Vol. 2, pp. 12311-12316 discloses a thermoelectric conversion material represented by the chemical formula $Mg_{3-x}Mn_xSb_2$ ($0 \leq x \leq 0.4$).

SUMMARY

An object of the present invention is to provide a novel thermoelectric conversion material.

The present invention provides a thermoelectric conversion material represented by the following chemical formula (I):

$$Mg_{3+m}A_aB_bD_{2-e}E_e \qquad (I)$$

where
the element A represents at least one selected from the group consisting of Ca, Sr, Ba and Yb;
the element B represents at least one selected from the group consisting of Mn and Zn;
the value of m is not less than −0.39 and not more than 0.42;
the value of a is not less than 0 and not more than 0.12;
the value of b is not less than 0 and not more than 0.48;
the element D represents at least one selected from the group consisting of Sb and Bi;
the element E represents at least one selected from the group consisting of Se and Te;
the value of e is not less than 0.001 and not more than 0.06;
the thermoelectric conversion material has a $La_2O_3$ crystal structure; and
the thermoelectric conversion material is of n-type.

The present invention provides a novel thermoelectric conversion material.

DETAILED DESCRIPTION OF THE EMBODIMENT

Hereinafter, the present invention will be described in detail.

The thermoelectric conversion material according to the present invention is represented by the following chemical formula (I):

$$Mg_{3+m}A_aB_bD_{2-e}E_e \qquad (I)$$

where
the element A represents at least one selected from the group consisting of Ca, Sr, Ba and Yb;
the element B represents at least one selected from the group consisting of Mn and Zn;
the value of m is not less than −0.39 and not more than 0.42;
the value of a is not less than 0 and not more than 0.12;
the value of b is not less than 0 and not more than 0.48;
the element D represents at least one selected from the group consisting of Sb and Bi;
the element E represents at least one selected from the group consisting of Se and Te; and
the value of e is not less than 0.001 and not more than 0.06.

The thermoelectric conversion material according to the present invention has a $La_2O_3$ crystal structure and is of n-type.

The value of a may be 0. Therefore, the thermoelectric conversion material according to the present invention need not contain the element A. Similarly, the value of b may be 0. Therefore, the thermoelectric conversion material according to the present invention need not contain the element B. Furthermore, the following mathematical formula (III) may be satisfied.

$$a=b=0 \qquad (III)$$

On the other hand, the thermoelectric conversion material according to the present invention must contain the element Mg, the element D and the element E.

The thermoelectric conversion material according to the present invention is characterized both by containing the element E and by the value of e of not less than 0.001 and not more than 0.06.

As well known in the technical field of thermoelectric conversion materials, performance of a thermoelectric conversion material is represented by a thermoelectric figure of merit ZT and a Seebeck coefficient S. As demonstrated in the inventive examples 1-4 and the comparative examples 1-2 which will be described later, the value of e of not less than 0.001 and not more than 0.06 improves the performance of the thermoelectric conversion material remarkably. See Table 3. Furthermore, such a thermoelectric conversion material is of n-type. On the other hand, as is demonstrated in the comparative example 1, when the value of e is equal to 0, the thermoelectric conversion material has low performance and is of p-type. Also when the value of e is more than 0.06, the performance of the thermoelectric conversion material is low. Desirably, the value of e is not less than 0.004 and not more than 0.020.

Figure 1:
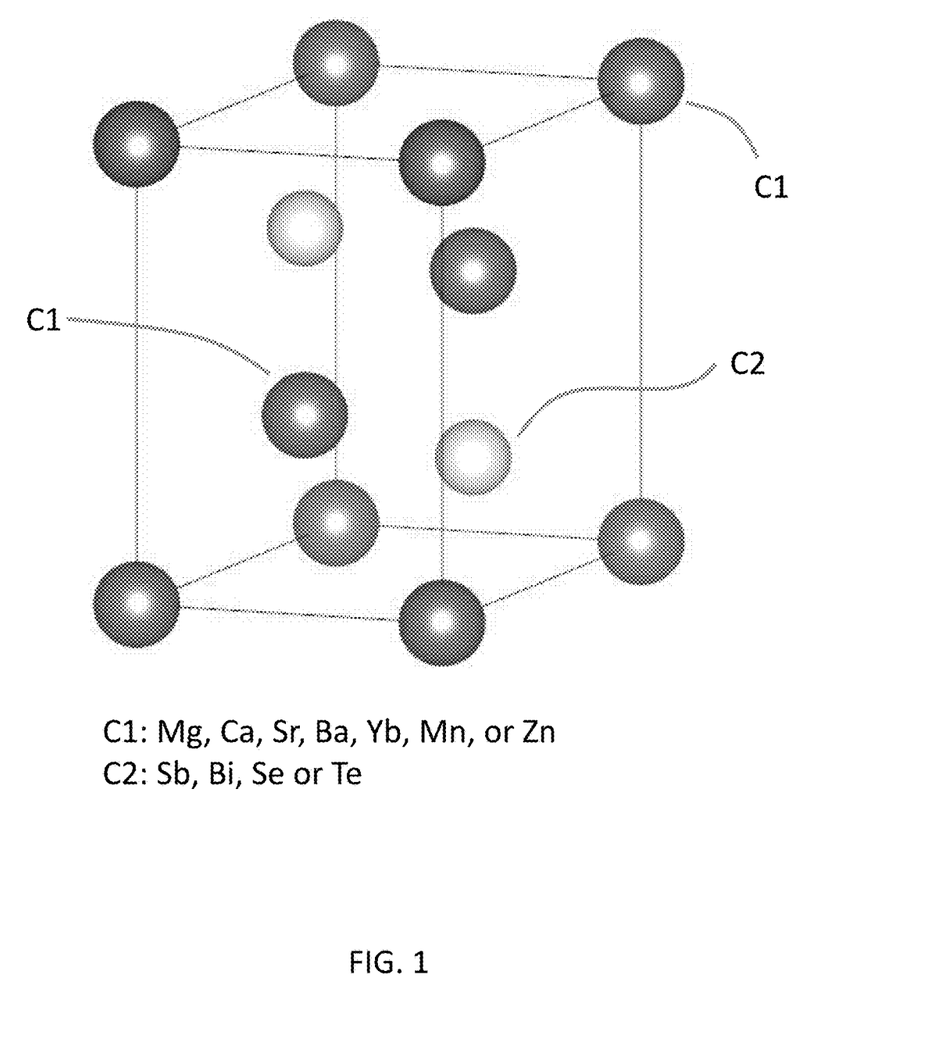
FIG. 1 shows a schematic view of a $La_2O_3$ crystal structure.

The thermoelectric conversion material according to the present invention has a $La_2O_3$ crystal structure. FIG. 1 shows a schematic view of the $La_2O_3$ crystal structure. The thermoelectric conversion material according to the present invention may be single-crystalline or polycrystalline.

The value of m is not less than −0.39 and not more than 0.42. See the inventive example 26 and the inventive example 29 which will be described later. The value of m may be not less than −0.39 and not more than 0.21. When at least one of the values a and b is more than 0, it is desirable that the following mathematical formula (II) is satisfied among the values of m, a, and b:

$$m = m' - a - b \tag{II}$$

where m' is not less than 0 and not more than 0.42.

Regarding the case where the value of m' is equal to 0, see the inventive example 26. Regarding the case where the value of m' is equal to 0.42, see the inventive example 29.

(Fabrication Method)

Hereinafter, an example of the fabrication method of the thermoelectric conversion material according to the present invention will be described. First, an antimony-bismuth alloy is obtained by melting antimony and bismuth by an arc melting method at a temperature of 1,000 degrees Celsius-1,500 degrees Celsius. Then, the antimony-bismuth alloy, magnesium powder, and selenium powder are put in a crucible. The crucible is heated to a temperature of 800 degrees Celsius-1,500 degrees Celsius to give a MgSbBiSe alloy.

Elements may scatter out of the crucible during the heating period. Therefore, the molar ratio of the obtained thermoelectric conversion material seldom accords with the molar ratio of the starting materials.

The MgSbBiSe alloy is subjected to spark plasma sintering to give a crystal of MgSbBiSe. In this way, the thermoelectric conversion material formed of the crystal of MgSbBiSe is obtained.

EXAMPLES

The present invention will be described in more detail with reference to the following examples.

Inventive Example 1

(Fabrication Method)

In the inventive example 1, a thermoelectric conversion material represented by the chemical formula $MG_{3.08}Sb_{1.49}Bi_{0.49}Se_{0.02}$ and having a $La_2O_3$ crystal structure was fabricated as below.

First, antimony grains (5.48 grams, 0.045 mol) and bismuth grains (3.01 grams, 0.0144 mol) were melted at a temperature of 1,000-1,500 degrees Celsius by an arc melting method to obtain an antimony-bismuth alloy. The alloy was ground in a mortar to obtain Sb—Bi powder.

Then, magnesium powder (2.33 grams, 0.096 mol) and selenium powder (0.0474 grams, 0.0006 mol) were added to the Sb—Bi powder. These powders were mixed sufficiently. In the inventive example 1, the molar ratio of the starting materials of Mg:Sb:Bi:Se was 0.096:0.045:0.0144:0.0006, namely, 3.2:1.5:0.48:0.02.

The mixed powder was put in a tableting machine to give a tablet. The tablet was put in a carbon crucible. The carbon crucible was filled with an argon gas. The tablet was heated at a temperature of 800-1,000 degrees Celsius for ten seconds. In this way, the tablet was melted to obtain an ingot.

The ingot was put in a mortar placed in a glove box filled with an argon gas. The ingot was ground in the glove box to obtain MgSbBiSe powder. Each particle had a particle size of not more than 100 μm.

The powder was sintered by a spark plasma sintering method (hereinafter, referred to as "SPS method") as below. First, the powder was put in a cylindrical die formed of graphite. The cylindrical die had an external diameter of 50 millimeters and an internal diameter of 10 millimeters. An argon gas was supplied to the cylindrical die. While a pressure of 50 MPa was applied to the materials put in the cylindrical die, a pulse electric current was caused to flow through the materials. In this way, the temperature of the materials put in the cylindrical die was raised at a rate of approximately 20 degrees Celsius/minute. The temperature of the materials was maintained at 600 degrees Celsius for 30 minutes. Then, the temperature of the materials was lowered to room temperature to obtain a dense sintered compact. In this way, the thermoelectric conversion material according to the inventive example 1 was obtained.

(Identification of Composition Ratio)

Figure 5:
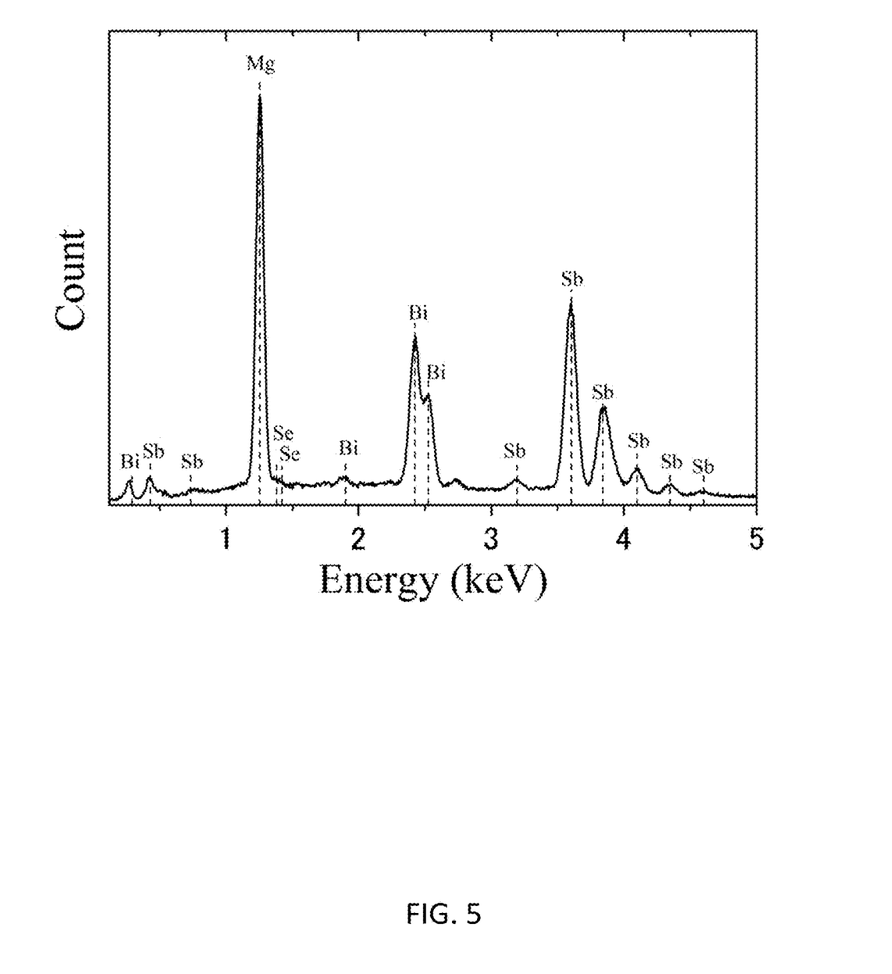
FIG. 5 is a graph showing the analysis result of the energy dispersive X-ray spectrometry in the inventive example 1.

The chemical composition of the thermoelectric conversion material according to the inventive example 1 was analyzed by an energy dispersive X-ray spectrometry (hereinafter, referred to as "EDX"). Specifically, the thermoelectric conversion material according to the inventive example 1 was subjected to an X-rays spectroscope (product of Bruker Corporation, brand name: XFlash6|10). FIG. 5 is a graph showing the results of the EDX in the inventive example 1. FIG. 5 reveals that the thermoelectric conversion material according to the inventive example 1 has a composition of $Mg_{3.08}Sb_{1.49}Bi_{0.49}Se_{0.02}$.

(Observation of Crystal Structure)

Figure 2A:
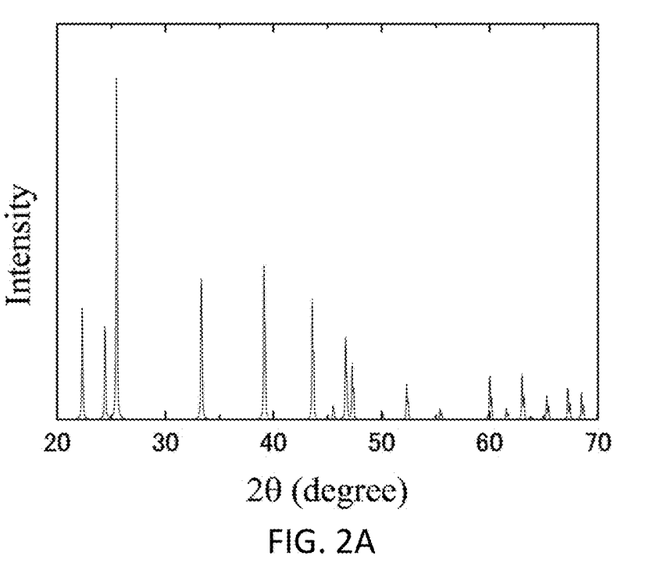
FIG. 2A is a graph showing a diffraction spectrum analysis result of a $La_2O_3$ crystal structure.
Figure 2B:
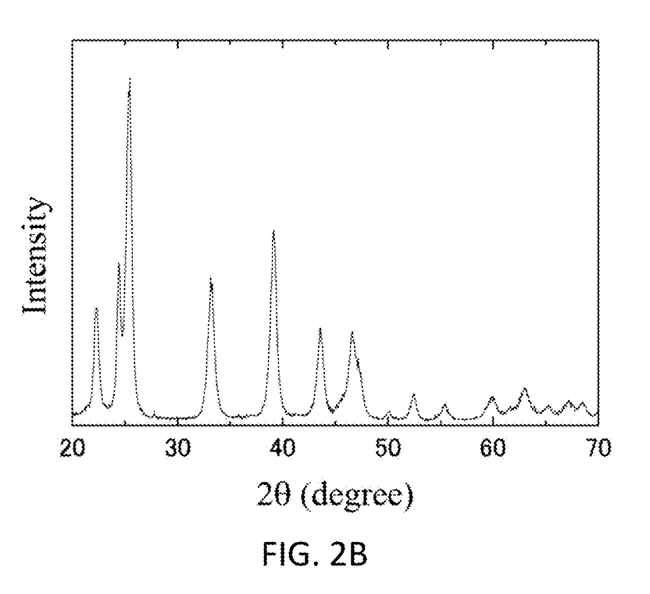
FIG. 2B is a graph showing the results of the X-ray diffraction analysis of the thermoelectric conversion material according to the inventive example 1.

The thermoelectric conversion material according to the inventive example 1 was subjected to an X-ray diffraction analysis. FIG. 2B shows the result thereof. FIG. 2A is a graph showing the X-ray diffraction spectrum of the $La_2O_3$ crystal structure (or $CaAl_2Si_2$ crystal structure) having an a-axis direction lattice constant of 0.460 nanometers, a b-axis direction lattice constant of 0.460 nanometers, and a c-axis direction lattice constant of 0.729 nanometers. The peaks included in the diffraction spectrum of the inventive example 1 accord with those of FIG. 2A. Therefore, FIG. 2B reveals that the thermoelectric conversion material according to the inventive example 1 has a $La_2O_3$ crystal structure.

Figure 6:
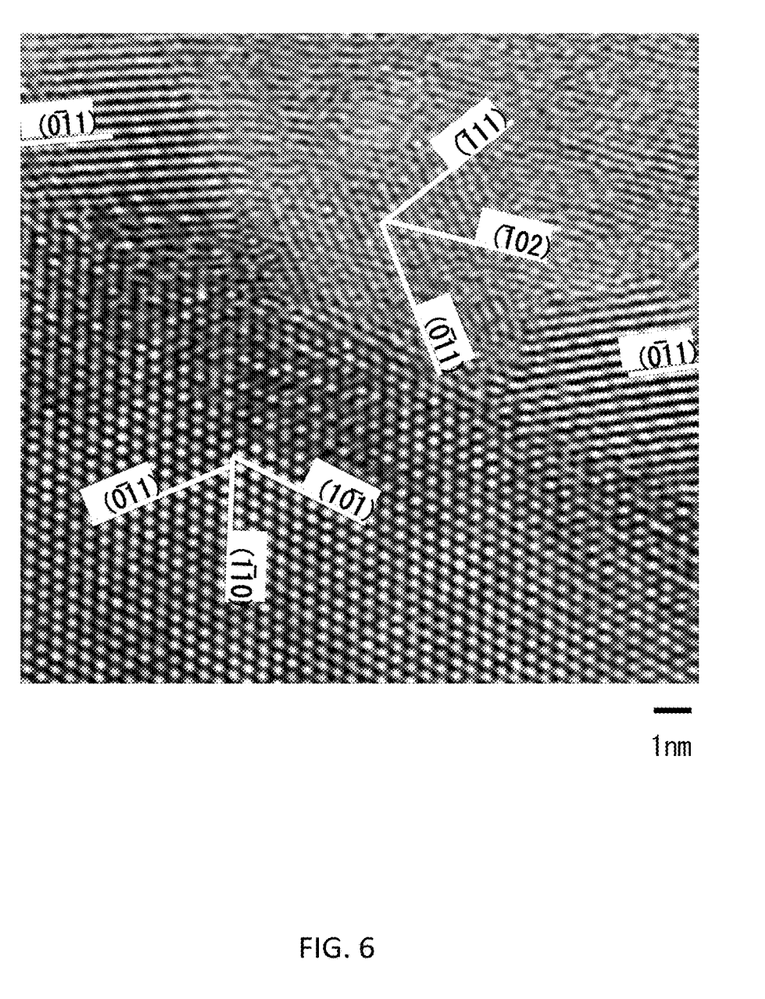
FIG. 6 shows a transmission electron microscope image of the thermoelectric conversion material according to the inventive example 1.

FIG. 6 shows a transmission electron microscope image of the thermoelectric conversion material according to the inventive example 1. The atomic arrangement periods of the crystal grains included in the $La_2O_3$ crystal structure having the above three lattice constants accord with the atomic arrangement periods defined along the orientation direction shown in FIG. 6. In other words, FIG. 6 reveals that the thermoelectric conversion material according to the inventive example 1 is a polycrystal having a $La_2O_3$ structure.

The following Table 1 shows the Seebeck coefficient S and the thermoelectric figure of merit ZT of the thermoelectric conversion material according to the inventive example 1. For the detail of the calculation method of the Seebeck coefficient S and the thermoelectric figure of merit ZT, see U.S. patent application Ser. No. 14/847,362, U.S. Pat. Nos. 9,761,776 and 9,853,200, which respectively correspond to International Application No. PCT/2014/001883, PCT/JP2014/001882, and PCT/JP2014/001885 and incorporated herein by reference.

TABLE 1

| Temperature (K) | Seebeck coefficient (μV/K) | Thermoelectric figure of merit ZT |
|---|---|---|
| 331 | −225 | 0.58 |
| 374 | −244 | 0.73 |
| 423 | −260 | 0.87 |
| 472 | −270 | 0.98 |
| 520 | −277 | 1.10 |
| 569 | −280 | 1.23 |
| 617 | −283 | 1.33 |
| 665 | −288 | 1.42 |
| 713 | −293 | 1.49 |

As is clear from Table 1, the Seebeck coefficients S are negative values. This means that the thermoelectric conversion material according to the inventive example 1 is of n-type.

The thermoelectric conversion material according to the inventive example 1 has the high thermoelectric figure of merit ZT of 0.58 even at a temperature of 331 K. Similarly, the thermoelectric conversion material according to the inventive example 1 has the high thermoelectric figure of merit ZT of 1.49 at a temperature of 713 K.

Comparative Example 1

An experiment similar to the inventive example 1 was conducted, except that the weights of antimony grains, bismuth grains, magnesium powder, and selenium powder were 5.48 grams (i.e., 0.045 mol), 3.13 grams (i.e., 0.015 mol), 2.33 grams (i.e., 0.096 mol) and 0 grams (i.e., 0 mol), respectively. Note that selenium was not used in the comparative example 1. In the comparative example 1, a thermoelectric conversion material represented by the chemical formula $Mg_{3.07}Sb_{1.47}Bi_{0.53}$ was obtained. In the comparative example 1, the molar ratio of the starting materials of Mg:Sb:Bi:Se was 0.096:0.045:0.015:0, namely, 3.2:1.5:0.5:0.

The following Table 2 shows the Seebeck coefficient S and the thermoelectric figure of merit ZT of the thermoelectric conversion material according to the comparative example 1.

TABLE 2

| Temperature (K) | Seebeck coefficient (μV/K) | Thermoelectric figure of merit ZT |
|---|---|---|
| 329 | 350 | 0.005 |
| 374 | 380 | 0.009 |
| 423 | 381 | 0.020 |
| 472 | 361 | 0.035 |
| 520 | 333 | 0.047 |
| 569 | 303 | 0.071 |
| 617 | 279 | 0.099 |

TABLE 2-continued

| Temperature (K) | Seebeck coefficient (μV/K) | Thermoelectric figure of merit ZT |
|---|---|---|
| 665 | 256 | 0.122 |
| 713 | 234 | 0.130 |

As is clear from the comparison of Table 1 to Table 2, the thermoelectric conversion material formed of the alloy of MgD which does not contain Se is of p-type. The addition of Se to the alloy of MgD improves the thermoelectric figure of merit ZT remarkably. In addition, the addition of Se to the alloy of MgD causes the value of the Seebeck coefficient S to be a negative value. This means that the addition of Se to the alloy of MgD causes the thermoelectric conversion material to be of n-type.

Inventive Examples 2-4 and Comparative Example 2

In the inventive examples 2-4 and the comparative example 2, an experiment similar to the inventive example 1 was conducted, except that the molar ratio of the starting materials of Mg:Sb:Bi:Se was the molar ratio shown in Table 3.

TABLE 3

| | Molar ratio of starting materials of Mg:Sb:Bi:Se | Composition of thermoelectric conversion material |
|---|---|---|
| Comparative example 1 | 3.2:1.5:0.500:0.000 | $Mg_{3.07}Sb_{1.47}Bi_{0.53}$ |
| Inventive example 3 | 3.2:1.5:0.499:0.001 | $Mg_{3.03}Sb_{1.513}Bi_{0.4986}Se_{0.001}$ |
| Inventive example 2 | 3.2:1.5:0.495:0.005 | $Mg_{3.12}Sb_{1.506}Bi_{0.489}Se_{0.005}$ |
| Inventive example 1 | 3.2:1.5:0.480:0.020 | $Mg_{3.08}Sb_{1.49}Bi_{0.49}Se_{0.02}$ |
| Inventive example 4 | 3.3:1.5:0.450:0.050 | $Mg_{3.15}Sb_{1.46}Bi_{0.48}Se_{0.06}$ |
| Comparative example 2 | 3.3:1.5:0.400:0.100 | $Mg_{3.09}Sb_{1.52}Bi_{0.40}Se_{0.08}$ |

| | $ZT_{max}$ ($T_{max}$) | $ZT_{330\,K}$ | $S_{330\,K}$ (μV/K) |
|---|---|---|---|
| Comparative example 1 | 0.13 (710 K) | 0.015 | 350 |
| Inventive example 3 | 0.44 (710 K) | 0.18 | −486 |
| Inventive example 2 | 1.09 (710 K) | 0.43 | −346 |
| Inventive example 1 | 1.49 (710 K) | 0.58 | −244 |
| Inventive example 4 | 0.58 (710 K) | 0.14 | −80 |
| Comparative example 2 | 0.14 (710 K) | 0.007 | −36 |

As is clear from Table 3, the value of e (i.e., the molar ratio of Se contained in the thermoelectric conversion material) is required to be not less than 0.001 and not more than 0.06 for the high thermoelectric figure of merit ZT and the negative Seebeck coefficient S. As is clear from the comparative example 1, when the value of e is equal to 0, the thermoelectric conversion material is of p-type. As is clear from the comparative example 2, when the value of e is equal to 0.08, all of the value of $ZT_{max}$, the value of $ZT_{330K}$ and the value of $S_{330K}$ are low. This means that the thermoelectric conversion material according to the comparative example 2 has low performance.

Inventive Examples 5-8 and Comparative Example 3

Figure 2C:
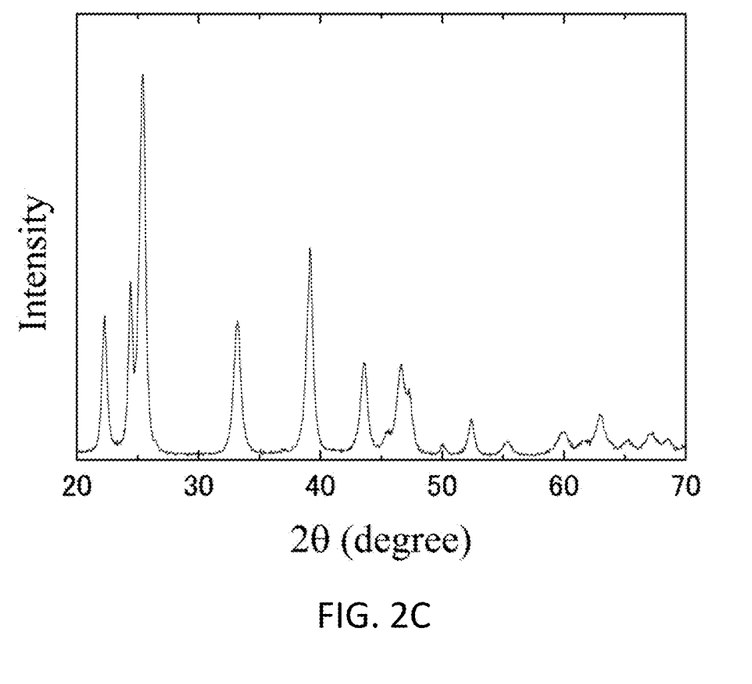
FIG. 2C is a graph showing the results of the X-ray diffraction analysis of the thermoelectric conversion material according to the inventive example 6.

In the inventive examples 5-8 and the comparative example 3, Te was used in place of Se. An experiment similar to the inventive example 1 was conducted, except that the molar ratio of the starting materials of Mg:Sb:Bi:Te was the molar ratio shown in Table 4. The thermoelectric conversion material according to the inventive example 6 was subjected to the X-ray diffraction analysis. FIG. 2C shows the result thereof. Similarly to the case of FIG. 2B (i.e., Inventive Example 1), FIG. 2C reveals that the thermoelectric conversion material according to the inventive example 6 also has a $La_2O_3$ crystal structure. In other words, FIG. 2C reveals that the thermoelectric conversion material containing Te in place of Se also has a $La_2O_3$ crystal structure.

TABLE 4

| | Molar ratio of starting materials of Mg:Sb:Bi:Te | Composition of thermoelectric conversion material |
|---|---|---|
| Comparative example 1 | 3.2:1.5:0.500:0.000 | $Mg_{3.07}Sb_{1.47}Bi_{0.53}$ |
| Inventive example 5 | 3.2:1.5:0.499:0.001 | $Mg_{3.03}Sb_{1.490}Bi_{0.509}Te_{0.001}$ |
| Inventive example 6 | 3.2:1.5:0.495:0.005 | $Mg_{3.14}Sb_{1.476}Bi_{0.520}Te_{0.004}$ |
| Inventive example 7 | 3.2:1.5:0.480:0.02 | $Mg_{3.08}Sb_{1.48}Bi_{0.50}Te_{0.02}$ |
| Inventive example 8 | 3.3:1.5:0.450:0.05 | $Mg_{3.17}Sb_{1.51}Bi_{0.45}Te_{0.04}$ |
| Comparative example 3 | 3.3:1.5:0.400:0.10 | $Mg_{3.06}Sb_{1.49}Bi_{0.42}Te_{0.09}$ |

| | $ZT_{max}$ ($T_{max}$) | $ZT_{330 K}$ | $S_{330 K}$ (μV/K) |
|---|---|---|---|
| Comparative example 1 | 0.13 (710 K) | 0.015 | 350 |
| Inventive example 5 | 0.74 (660 K) | 0.21 | −360 |
| Inventive example 6 | 1.35 (660 K) | 0.34 | −220 |
| Inventive example 7 | 1.14 (660 K) | 0.26 | −141 |
| Inventive example 8 | 0.5 (710 K) | 0.12 | −70 |
| Comparative example 3 | 0.22 (710 K) | 0.013 | −52 |

As is clear from Table 4, it is desirable that the value of e (i.e., the molar ratio of the Te contained in the thermoelectric conversion material) is not less than 0.001 and not more than 0.004. In light of Table 3, also in a case where Te is used in place of Se, the thermoelectric conversion material would have high performance, if the value of e is not more than 0.06. As is clear from the comparative example 3, when the value of e is equal to 0.09, all of the value of $ZT_{max}$, the value of $ZT_{330K}$ and the value of $S_{330K}$ are low. This means that the thermoelectric conversion material according to the comparative example 3 has low performance.

Inventive Examples 9-12

In the inventive examples 9-12, an experiment similar to the inventive example 1 was conducted, except that the molar ratio of the starting materials of Mg:Sb:Bi:Se was the molar ratio shown in Table 5.

TABLE 5

| | Molar ratio of starting materials of Mg:Sb:Bi:Se | Composition of thermoelectric conversion material |
|---|---|---|
| Inventive example 9 | 3.40:1.98:0.00:0.02 | $Mg_{3.21}Sb_{1.980}Se_{0.02}$ |
| Inventive example 10 | 3.20:1.00:0.98:0.02 | $Mg_{3.12}Sb_{1.04}Bi_{0.94}Se_{0.02}$ |
| Inventive example 11 | 3.20:0.50:1.48:0.02 | $Mg_{3.00}Sb_{0.49}Bi_{1.49}Se_{0.02}$ |
| Inventive example 12 | 3.30:0.00:1.98:0.02 | $Mg_{3.07}Bi_{1.98}Se_{0.02}$ |

| | $ZT_{max}$ ($T_{max}$) | $ZT_{330 K}$ | $S_{330 K}$ (μV/K) |
|---|---|---|---|
| Inventive example 9 | 0.51 (710 K) | 0.04 | −161 |
| Inventive example 10 | 0.75 (470 K) | 0.43 | −239 |
| Inventive example 11 | 0.39 (420 K) | 0.21 | −130 |
| Inventive example 12 | 0.08 (420 K) | 0.06 | −76 |

As is clear from Table 5, even when either Sb or Bi is not contained, the thermoelectric conversion material according to the present invention has high performance.

Inventive Examples 13-20 and Comparative Example 4

The thermoelectric conversion materials according to the inventive examples 13-20 and the comparative example 4 further contained at least one selected from the group consisting of Ca, Sr, Ba and Yb. In other words, in the inventive examples 13-20 and the comparative example 4, an experiment similar to the inventive example 1 was conducted, except that the molar ratio of the starting materials of Mg:A:Sb:Bi:Se (A represents at least one selected from the group consisting of Ca, Sr, Ba and Yb) is the molar ratio shown in Table 6. Ca powder, Sr powder, Ba powder, and Yb powder were melted together with the Bi grains and Sb grains by the arc melting method.

TABLE 6

| | Molar ratio of starting materials of Mg:A:Sb:Bi:Se | Composition of thermoelectric conversion material |
|---|---|---|
| Comparative example 4 (A = Ca) | 3.18:0.02:1.50:0.50:0.00 | $Mg_{3.07}Ca_{0.02}Sb_{1.48}Bi_{0.52}$ |
| Inventive example 13 (A = Ca) | 3.18:0.02:1.50:0.48:0.02 | $Mg_{3.12}Ca_{0.02}Sb_{1.54}Bi_{0.43}Se_{0.03}$ |
| Inventive example 14 (A = Ca) | 3.10:0.10:1.50:0.48:0.02 | $Mg_{2.99}Ca_{0.09}Sb_{1.52}Bi_{0.46}Se_{0.02}$ |
| Inventive example 15 (A = Sr) | 3.18:0.02:1.50:0.48:0.02 | $Mg_{3.03}Sr_{0.01}Sb_{1.49}Bi_{0.49}Se_{0.02}$ |
| Inventive example 16 (A = Sr) | 3.10:0.10:1.50:0.48:0.02 | $Mg_{2.97}Sr_{0.09}Sb_{1.47}Bi_{0.51}Se_{0.02}$ |
| Inventive example 17 (A = Ba) | 3.18:0.02:1.50:0.48:0.02 | $Mg_{3.05}Ba_{0.02}Sb_{1.55}Bi_{0.43}Se_{0.02}$ |
| Inventive example 18 (A = Ba) | 3.10:0.10:1.50:0.48:0.02 | $Mg_{2.95}Ba_{0.11}Sb_{1.52}Bi_{0.45}Se_{0.03}$ |
| Inventive example 19 (A = Yb) | 3.18:0.02:1.50:0.48:0.02 | $Mg_{3.04}Yb_{0.02}Sb_{1.46}Bi_{0.52}Se_{0.02}$ |
| Inventive example 20 (A = Yb) | 3.10:0.10:1.50:0.48:0.02 | $Mg_{2.91}Yb_{0.12}Sb_{1.51}Bi_{0.47}Se_{0.02}$ |

TABLE 6-continued

|  | $ZT_{max}$ ($T_{max}$) | $ZT_{330\,K}$ | $S_{330\,K}$ ($\mu V/K$) |
|---|---|---|---|
| Comparative example 4 | 0.32 (710 K) | 0.07 | 165 |
| Inventive example 13 | 0.86 (610 K) | 0.13 | −243 |
| Inventive example 14 | 0.67 (610 K) | 0.03 | −274 |
| Inventive example 15 | 0.71 (660 K) | 0.09 | −212 |
| Inventive example 16 | 0.69 (660 K) | 0.05 | −269 |
| Inventive example 17 | 1.09 (710 K) | 0.15 | −250 |
| Inventive example 18 | 0.42 (710 K) | 0.03 | −281 |
| Inventive example 19 | 0.92 (710 K) | 0.09 | −279 |
| Inventive example 20 | 0.55 (710 K) | 0.05 | −326 |

As is clear from Table 6, the thermoelectric conversion material according to the present invention can further contain at least one selected from the group consisting of Ca, Sr, Ba and Yb.

Inventive Examples 21-26 and Comparative Examples 5-6

The thermoelectric conversion materials according to the inventive examples 21-26 and the comparative examples 5-6 further contained at least one selected from the group consisting of Mn and Zn. In other words, in the inventive examples 21-26 and the comparative examples 5-6, an experiment similar to the inventive example 1 was conducted, except that the molar ratio of the starting materials of Mg:B:Sb:Bi:Se (B represents at least one selected from the group consisting of Mn and Zn) is the molar ratio shown in Table 7. Mn powder was melted together with the Bi grains and Sb grains by the arc melting method. Zn powder was put in the carbon crucible together with the tablet.

TABLE 7

|  | Molar ratio of starting materials of Mg:B:Sb:Bi:Se | Composition of thermoelectric conversion material |
|---|---|---|
| Comparative example 5 | 3.10:0.10:1.50:0.50:0.00 (B = Mn) | $Mg_{2.95}Mn_{0.10}Sb_{1.48}Bi_{0.52}$ |
| Inventive example 21 | 3.10:0.10:1.50:0.48:0.02 (B = Mn) | $Mg_{2.98}Mn_{0.1}Sb_{1.48}Bi_{0.50}Se_{0.02}$ |
| Inventive example 22 | 3.00:0.30:1.50:0.48:0.02 (B = Mn) | $Mg_{2.87}Mn_{0.34}Sb_{1.47}Bi_{0.51}Se_{0.02}$ |
| Inventive example 23 | 2.80:0.50:1.50:0.48:0.02 (B = Mn) | $Mg_{2.63}Mn_{0.48}Sb_{1.54}Bi_{0.44}Se_{0.02}$ |
| Comparative example 6 | 3.10:0.10:1.50:0.50:0.00 (B = Zn) | $Mg_{3.03}Zn_{0.07}Sb_{1.53}Bi_{0.47}$ |
| Inventive example 24 | 3.10:0.10:1.50:0.48:0.02 (B = Zn) | $Mg_{2.94}Zn_{0.07}Sb_{1.5}Bi_{0.48}Se_{0.02}$ |
| Inventive example 25 | 3.00:0.30:1.50:0.48:0.02 (B = Zn) | $Mg_{2.84}Zn_{0.26}Sb_{1.49}Bi_{0.49}Se_{0.02}$ |
| Inventive example 26 | 2.80:0.50:1.50:0.48:0.02 (B = Zn) | $Mg_{2.61}Zn_{0.39}Sb_{1.47}Bi_{0.5}Se_{0.03}$ |

|  | $ZT_{max}$ ($T_{max}$) | $ZT_{330\,K}$ | $S_{330\,K}$ ($\mu V/K$) |
|---|---|---|---|
| Comparative example 5 | 0.21 (710 K) | 0.05 | 247 |
| Inventive example 21 | 1.3 (710 K) | 0.22 | −312 |
| Inventive example 22 | 0.76 (470 K) | 0.1 | −221 |
| Inventive example 23 | 0.04 (330 K) | 0.04 | −146 |
| Comparative example 6 | 0.24 (710 K) | 0.06 | 216 |
| Inventive example 24 | 0.86 (710 K) | 0.1 | −306 |
| Inventive example 25 | 0.53 (470 K) | 0.07 | −346 |
| Inventive example 26 | 0.03 (370 K) | 0.02 | −163 |

As is clear from Table 7, the thermoelectric conversion material according to the present invention can further contain at least one selected from the group consisting of Mn and Zn.

Inventive Examples 27-29

In the inventive examples 27-29, an experiment similar to the inventive example 1 was conducted, except that the molar ratio of the starting materials of Mg:Sb:Bi:Se was the molar ratio shown in Table 8.

TABLE 8

|  | Molar ratio of starting materials of Mg:Sb:Bi:Se | Composition of thermoelectric conversion material |
|---|---|---|
| Inventive example 27 | 3.3:1.5:0.480:0.020 | $Mg_{3.24}Sb_{1.49}Bi_{0.49}Se_{0.02}$ |
| Inventive example 28 | 3.4:1.5:0.480:0.020 | $Mg_{3.36}Sb_{1.49}Bi_{0.49}Se_{0.02}$ |
| Inventive example 29 | 3.5:1.5:0.480:0.020 | $Mg_{3.42}Sb_{1.49}Bi_{0.49}Se_{0.022}$ |

|  | $ZT_{max}$ ($T_{max}$) | $ZT_{330\,K}$ | $S_{330\,K}$ ($\mu V/K$) |
|---|---|---|---|
| Inventive example 27 | 1.05 (720 K) | 0.17 | −270 |
| Inventive example 28 | 1.03 (720 K) | 0.14 | −268 |
| Inventive example 29 | 0.91 (720 K) | 0.25 | −287 |

As is clear from Table 8, the thermoelectric conversion materials according to the inventive examples 27-29 also have the high thermoelectric figure of merit ZT.

Figure 3:
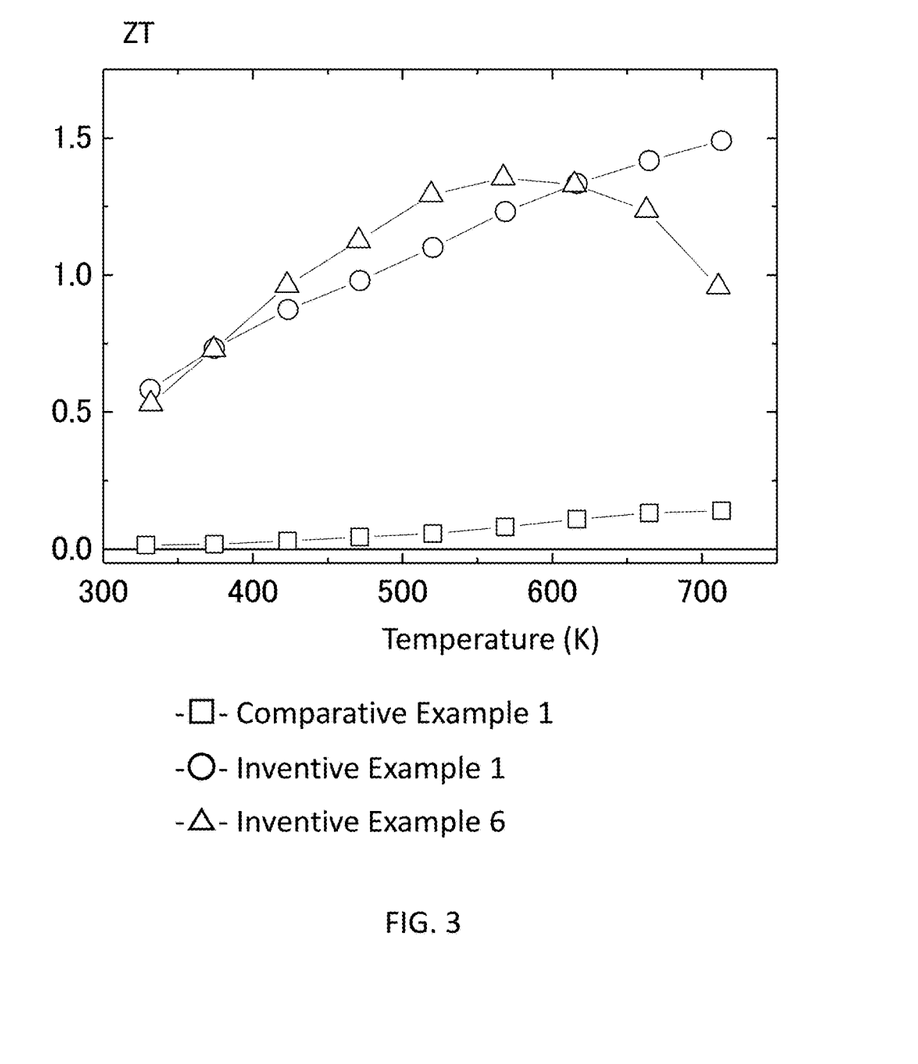
FIG. 3 is a graph showing a relation between a temperature and the thermoelectric figure of merit ZT of the thermoelectric conversion materials according to the inventive example 1, the inventive example 6, and the comparative example 1.

FIG. 3 is a graph showing a relation between a temperature and the thermoelectric figure of merit ZT of the thermoelectric conversion materials according to the inventive example 1, the inventive example 6, and the comparative example 1.

Figure 4:
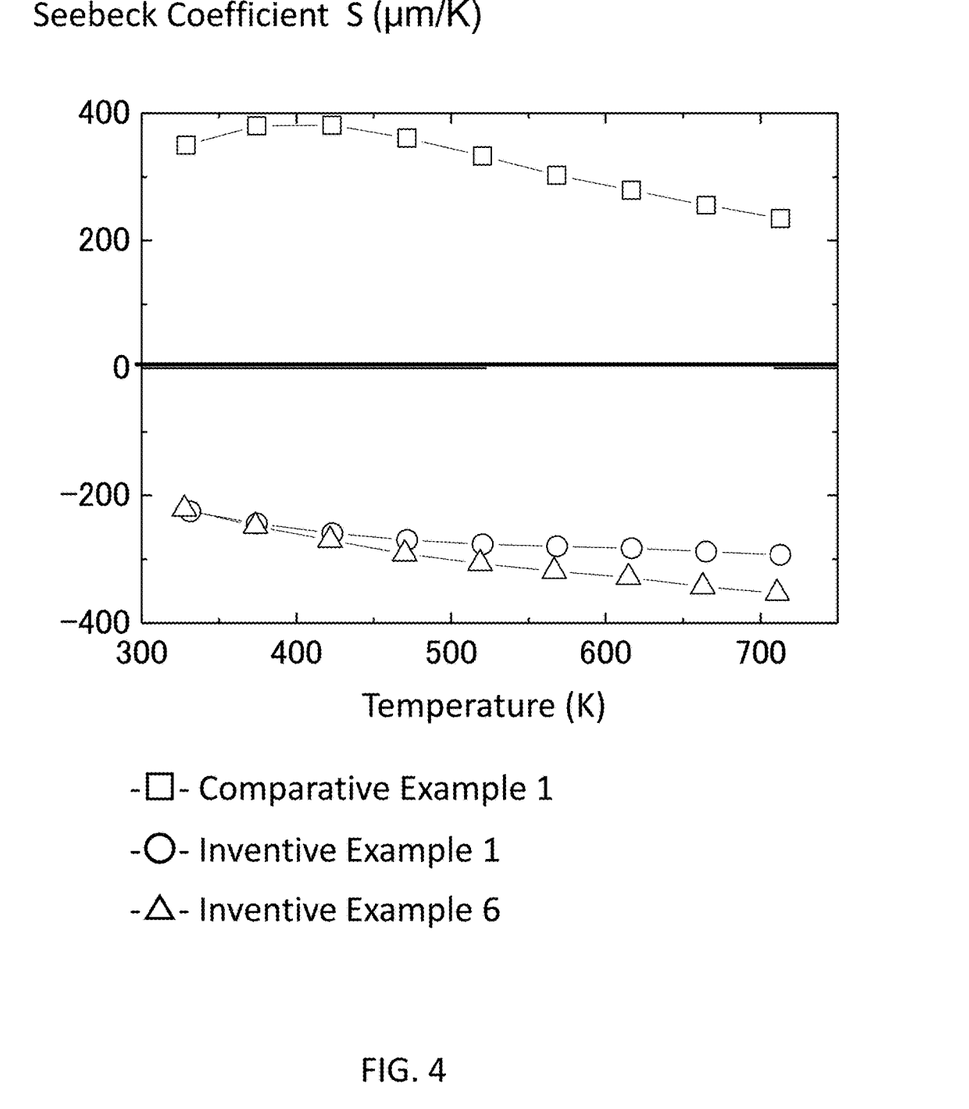
FIG. 4 is a graph showing a relation between a temperature and the Seebeck coefficient S of the thermoelectric conversion materials according to the inventive example 1, the inventive example 6, and the comparative example 1.

FIG. 4 is a graph showing a relation between a temperature and the Seebeck coefficient S of the thermoelectric conversion materials according to the inventive example 1, the inventive example 6, and the comparative example 1.

As is clear from FIG. 3 and FIG. 4, the addition of Se to the alloy of MgD improves the thermoelectric figure of merit ZT remarkably. In addition, the addition of Se to the alloy of MgD causes the value of the Seebeck coefficient S to be a negative value. This means that the addition of Se to the alloy of MgD causes the thermoelectric conversion material to be of n-type.

INDUSTRIAL APPLICABILITY

The thermoelectric conversion material according to the present invention can be used for a thermoelectric conversion device for converting thermal energy into electric energy.

The invention claimed is:

1. A thermoelectric conversion material represented by the following chemical formula (I):

$$Mg_{3+m}A_aB_bD_{2-e}E_e \quad (I)$$

where
the element A represents at least one selected from the group consisting of Ca, Sr, Ba and Yb;
the element B represents at least one selected from the group consisting of Mn and Zn;
the value of m is not less than −0.39 and not more than 0.42;
the value of a is not less than 0 and not more than 0.12;
the value of b is not less than 0 and not more than 0.48;
the element D represents at least one selected from the group consisting of Sb and Bi;
the element E represents at least one selected from the group consisting of Se and Te;
the value of e is not less than 0.001 and not more than 0.06;
the thermoelectric conversion material has a $La_2O_3$ crystal structure; and
the thermoelectric conversion material is of n-type.

2. The thermoelectric conversion material according to claim 1, wherein
the following mathematical formula (II) is satisfied:

$$m = m' - a - b \quad (II)$$

where
at least one of the values of a and b is more than 0; and
the value of m' is not less than 0 and not more than 0.42.

3. The thermoelectric conversion material according to claim 1, wherein
the value of e is not less than 0.004 and not more than 0.020.

4. The thermoelectric conversion material according to claim 2, wherein
the value of e is not less than 0.004 and not more than 0.020.

5. The thermoelectric conversion material according to claim 1, wherein
the following mathematical formula (III) is satisfied:

$$a = b = 0 \quad (III).$$

* * * * *